United States Patent
Jin

(10) Patent No.: US 9,252,030 B1
(45) Date of Patent: Feb. 2, 2016

(54) SYSTEM-IN-PACKAGES AND METHODS FOR FORMING SAME

(71) Applicant: STMicroelectronics Pte Ltd, Singapore (SG)

(72) Inventor: Yonggang Jin, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 14/450,554

(22) Filed: Aug. 4, 2014

(51) Int. Cl.
| | |
|---|---|
| *H01L 23/49* | (2006.01) |
| *H01L 21/56* | (2006.01) |
| *H01L 25/00* | (2006.01) |
| *H01L 21/48* | (2006.01) |
| *H01L 21/78* | (2006.01) |
| *H01L 23/498* | (2006.01) |
| *H01L 25/07* | (2006.01) |

(52) U.S. Cl.
CPC .......... *H01L 21/563* (2013.01); *H01L 21/4803* (2013.01); *H01L 21/486* (2013.01); *H01L 21/4853* (2013.01); *H01L 21/565* (2013.01); *H01L 21/78* (2013.01); *H01L 23/49811* (2013.01); *H01L 23/49827* (2013.01); *H01L 23/49838* (2013.01); *H01L 23/49861* (2013.01); *H01L 25/072* (2013.01); *H01L 25/50* (2013.01)

(58) Field of Classification Search
CPC ..... H01L 24/94; H01L 25/50; H01L 25/0657; H01L 24/32; H01L 24/17; H01L 21/304; H01L 24/83; H01L 24/97; H01L 2224/80815; H01L 2224/94; H01L 2224/97; H01L 2924/18161; H01L 2225/06513; H01L 2225/06541; H01L 2224/83
See application file for complete search history.

(56) References Cited

U.S. PATENT DOCUMENTS

| | | | |
|---|---|---|---|
| 8,022,555 B2 * | 9/2011 | Hwang et al. | 257/777 |
| 2013/0062764 A1 | 3/2013 | Jin | |
| 2015/0115433 A1 * | 4/2015 | Lin et al. | 257/712 |

* cited by examiner

*Primary Examiner* — Roy Potter
*Assistant Examiner* — Paul Patton
(74) *Attorney, Agent, or Firm* — Seed IP Law Group PLLC

(57) ABSTRACT

One or more embodiments are directed to a system-in-package (SiP) that includes a plurality of semiconductor chips and an interposer that that are molded in an encapsulation layer together. That is, a single processing step may be used to encapsulate the semiconductor chips and the interposer in the encapsulation layer. Furthermore, prior to setting or curing, the encapsulation layer is able to flow between the semiconductor chips and the interposer to provide further mechanical support for the semiconductor chips. Thus, the process for forming the SiP is reduced, resulting in a faster processing time and a lower cost. Additionally, one or more embodiments described herein reduce or eliminate warpage of the interposer.

18 Claims, 12 Drawing Sheets

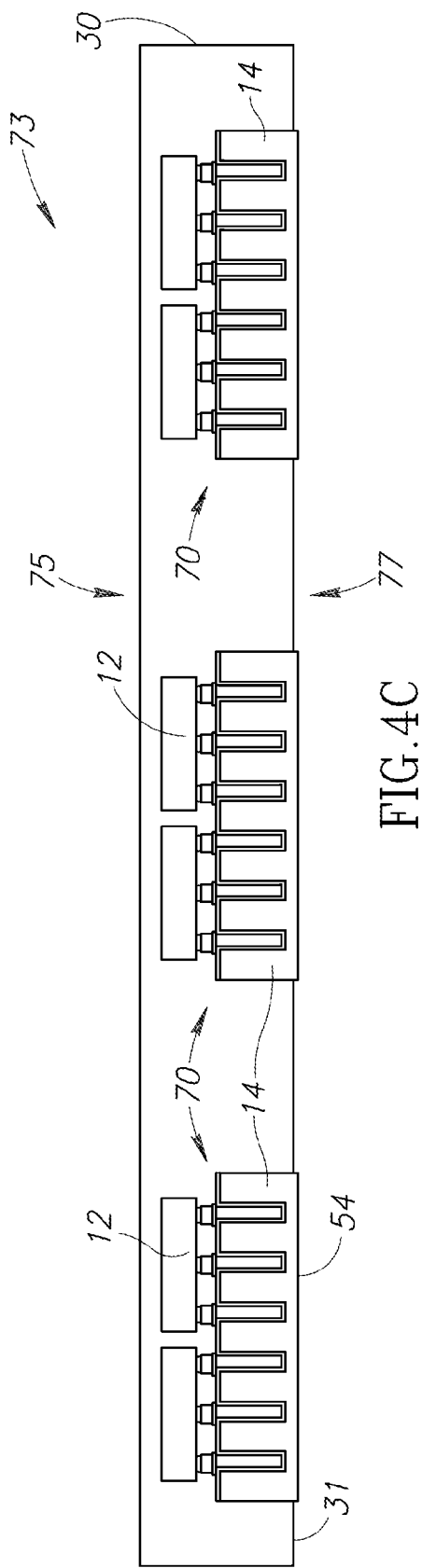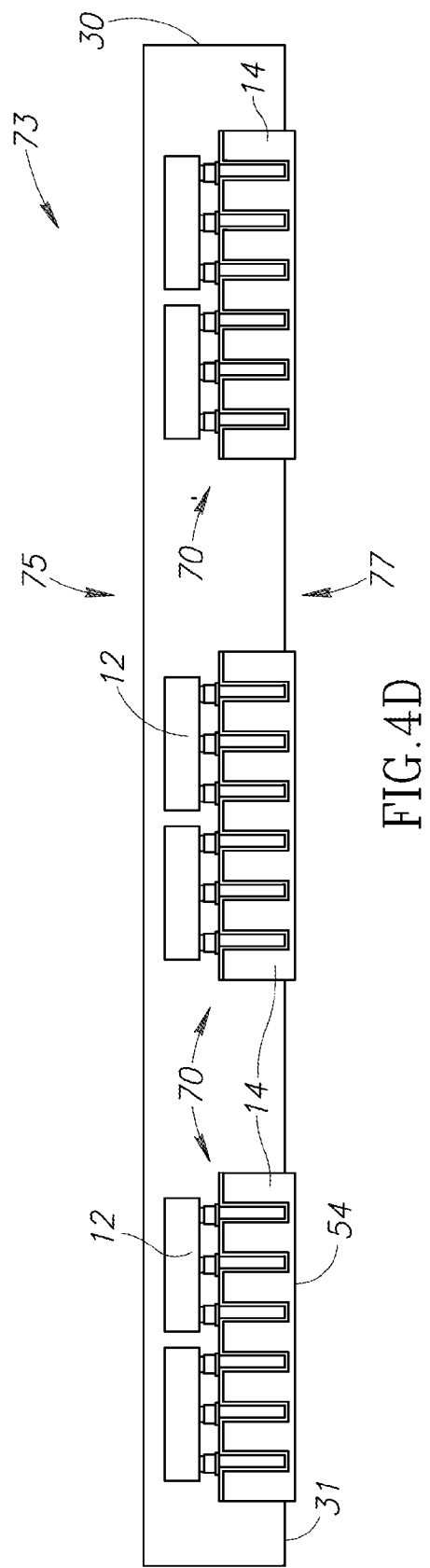
FIG. 4C
FIG. 4D

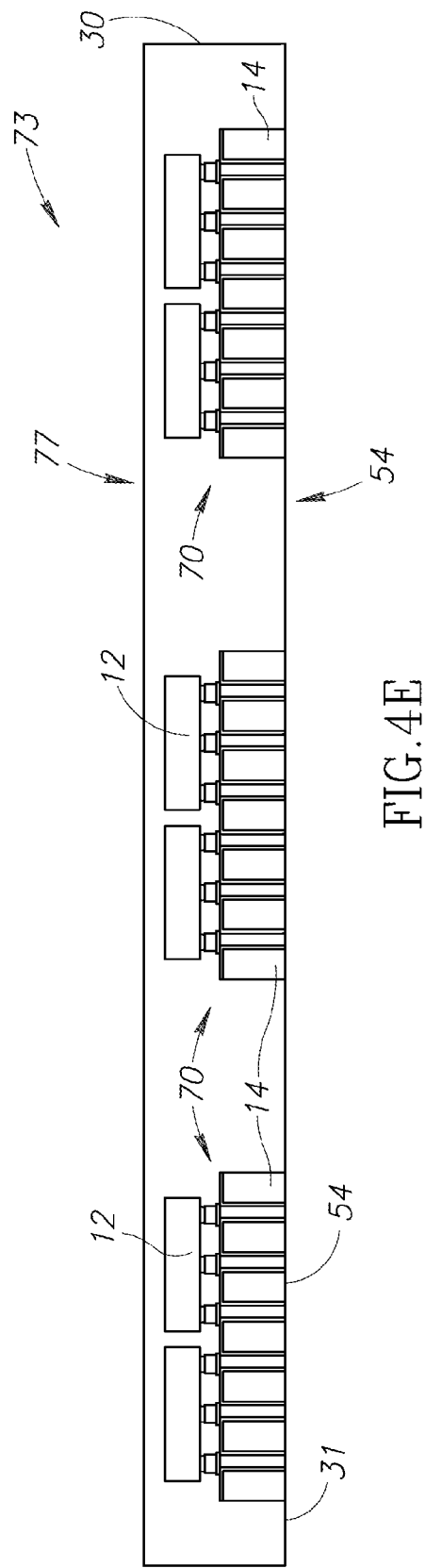

SYSTEM-IN-PACKAGES AND METHODS FOR FORMING SAME

BACKGROUND

1. Technical Field

The present disclosure is directed to system-in-packages (SiP) and methods for forming same.

2. Description of the Related Art

System-in-packages (SiP) include multiple semiconductor dice or chips enclosed in a single package body. The semiconductor chips may be located side by side, such as in 2.5-D packages, or stacked on top of each other, such as in 3-D packages.

The SiP typically includes an interposer that is located between the package substrate and the semiconductor chips. In a 2.5-D package, each of the semiconductor chips is electrically coupled to a first side of the interposer substrate, such as in a flip chip configuration.

Generally described, flip chip technology refers to a process and structure in which electrical contacts, e.g., solder bumps, are placed on a semiconductor chip in contact with contact pads of the chip, forming a ball grid array (BGA) on the face of the chip. The chip is then placed active-side down on the interposer with the solder bumps coupled to interconnects or pillars of the interposer. In a reflow step, the solder bumps are reflowed in a heating step to form a solder joint that adheres the contact pads of the chip to the interconnects or pillars of the interposer.

Typically, the first side of the interposer has high density interconnects for coupling bond pads of the semiconductor chips. Thus, the bumps for connecting the bond pads with the interconnects of the first side of the interposer are quite small, such as about 50 microns.

A second side of the interposer is coupled to a package substrate, which forms an outer surface of the SiP. The second side of the interposer includes interconnects that allow for larger solder bumps, such as about 100 microns, for connection to the package substrate. The total thickness of a typical SiP at this stage is about 300 microns. The package substrate may be further processed to have package bumps, e.g., solder balls, formed thereon for coupling to another substrate or board, such as a printed circuit board.

The process of forming the above-described SiP involves separately processing the first and second side of the interposer at wafer level. Typically, the second side of the interposer is processed first to form metal interconnects, copper pillars on the metal interconnects, and solder bumps over the copper pillars. A dielectric layer is formed over the second side of the interposer and around the copper pillars and solder bump. A carrier substrate is mounted to the dielectric layer. The carrier substrate provides support to the interposer while the first side of the interposer is processed to form metal interconnects and copper pillars.

After the copper pillars have been formed on the first side of the interposer, solder bumps of the semiconductor chips are coupled to the front side copper pillars using flip chip technology as discussed. An underfill step is performed to provide underfill material between the semiconductor chips and the interposer. The underfill material is typically an electrically insulating adhesive that is provided around the solder bumps and pillars that couple the semiconductor chip to the interposer. The underfill material provides further mechanical support for the semiconductor chips.

An encapsulation step is performed to encapsulate the semiconductor chips and the interposer. The carrier substrate and the dielectric layer may then be removed. The interposer-chip assembly is then singulated and coupled to a package substrate using flip chip technology. That is, the solder bumps on the first side of the interposer are placed face down onto the package substrate. Again, an underfill step is performed to provide underfill material between the package substrate and the interposer. An encapsulation step is again performed to encapsulate the interposer and over package substrate. Finally, in view of the process being performed at wafer level, a dicing step is then performed for separating into individual SiPs.

The above process includes repetitive steps, such as the underfill and encapsulation steps. In that regard, the process can be unduly costly and time consuming. Furthermore, mounting and demounting the carrier substrate to the interposer can cause warpage of the interposer.

BRIEF SUMMARY

One or more embodiments are directed to a system-in-package (SiP) that includes a plurality of semiconductor chips and an interposer that that are molded in an encapsulation layer together. That is, a single processing step may be used to encapsulate the semiconductor chips and the interposer in the encapsulation layer. Furthermore, prior to setting or curing, the encapsulation layer is able to flow between the semiconductor chips and the interposer to provide further mechanical support for the semiconductor chips. Thus, the process for forming the SiP is reduced, resulting in a faster processing time and a lower cost. Additionally, one or more embodiments described herein reduce or eliminate warpage of the interposer.

In one embodiment a surface of the interposer itself may be coupled directly to a printed circuit board, thereby eliminating a need for a package substrate, resulting in yet a thinner package than was previously available. In one embodiment, the SiP has a thickness of about 100 microns, which is more than half the thickness of the SiPs described above.

BRIEF DESCRIPTION OF THE SEVERAL VIEWS OF THE DRAWINGS

In the drawings, identical reference numbers identify similar elements. Sizes and relative positions of elements in the drawings are not necessarily drawn to scale.

FIGS. 4A-4G illustrate exemplary method steps for forming a redistribution layer on the interposer chip assembly.

DETAILED DESCRIPTION

Figure 1:
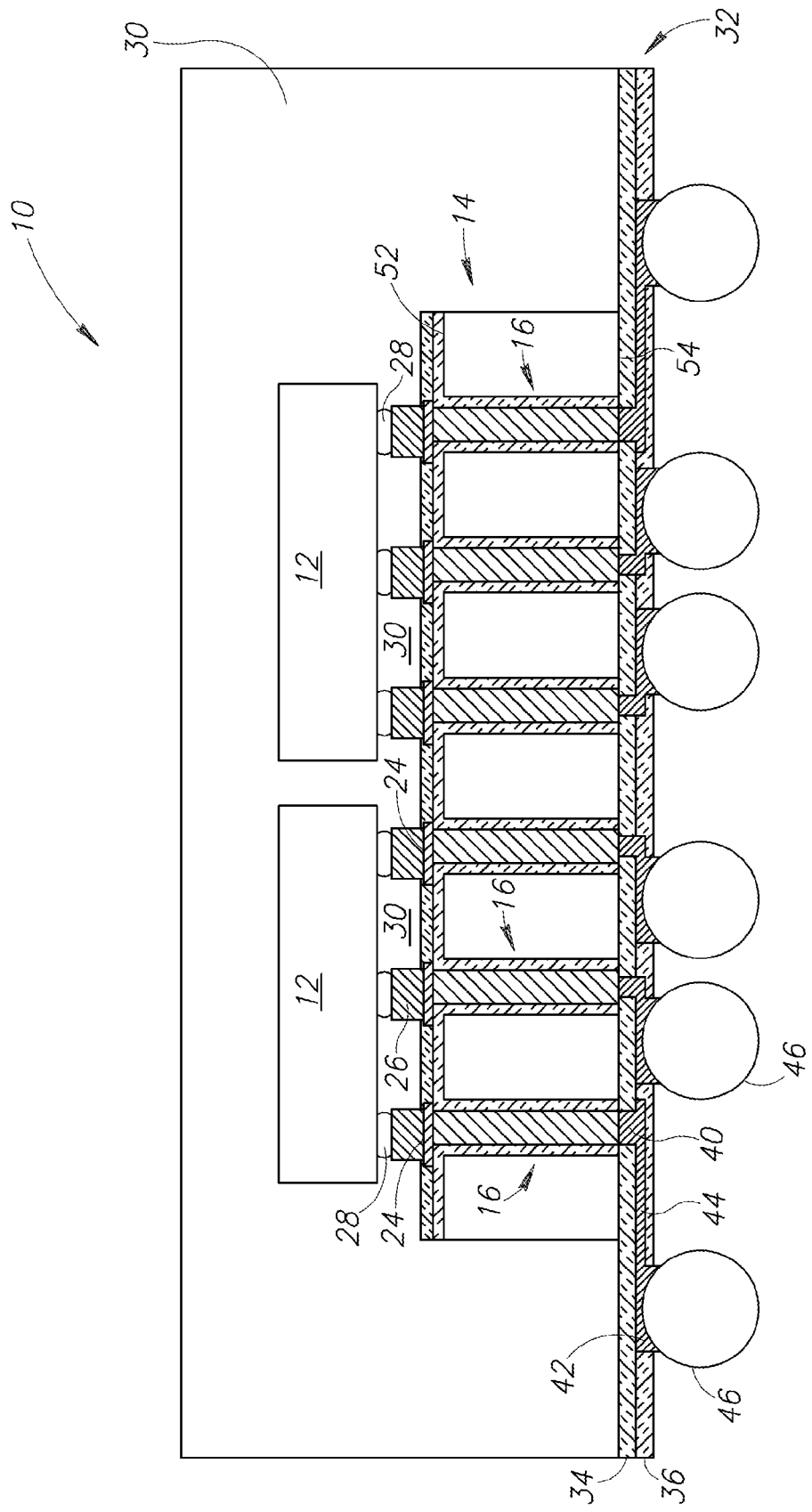
FIG. 1 is a schematic illustration of a package in accordance with one embodiment of the disclosure.

FIG. 1 illustrates a 2.5-D system-in-package (SiP) 10 in accordance with one embodiment of the present disclosure. The package 10 includes two or more semiconductor chips 12 having an electronic device, such as integrated circuits, formed on an active face thereof. The semiconductor chips 12 are mounted active face down and side by side in a flip chip configuration on a first side of an interposer 14. The interposer 14 may be any substrate configured to support the semiconductor chips 12. In some embodiments, the interposer 14 is silicon or glass.

The interposer 14 includes conductive through vias 16 that extend from the first side 52 to a second side 54 of the interposer 14. Between the conductive through vias 16 at the first side 52 and the semiconductor chips 12 are metal interconnects 24, pillars 26, and solder bumps 28. The solder bumps 28 couple bond pads of the semiconductor chips 12 to the pillars 26.

An encapsulation layer 30 surrounds the semiconductor chips 12 and portions of the interposer 14. Additionally, the encapsulation layer 30 is located between the active face of the semiconductor chips 12 and the first side 52 of the interposer 14. That is, the encapsulation layer 30 surrounds the pillars 26 and solder bumps 28 that couple the semiconductor chips 12 to the interposer 14, thereby providing further mechanical support therebetween. The encapsulation layer 30 also protects the semiconductor chips 12 and the interposer 14 from external environmental sources of damage, such as corrosion, physical damage, moisture damage, or other causes of damage to electrical devices.

The encapsulation layer 30 is formed from a flowable material that hardens over time, such as in one or more curing steps. In one embodiment, the encapsulation layer 30 is a molding compound, such as a polymer resin. Prior to hardening, the encapsulation material that forms the encapsulation layer 30 preferably has a suitable low viscosity so that the encapsulation material can flow between the semiconductor chip 12 and the interposer 14 around the conductive pillars 26 and solder bumps 28 as mentioned above. In that regard, an underfill material is not needed. It is to be appreciated, however, that an underfill material may be used, if desired.

The second side 54 of the interposer 14 and a surface of the encapsulation layer 30 form a substantially planar surface on which a redistribution layer 32 is formed. The redistribution layer 32 includes at least one dielectric and conductive layer that redistribute electrical contacts of the conductive through vias 16 of the interposer 14. In particular, first and second dielectric layers 34, 36 are stacked on the second side 54 of the interposer 14. Openings in the first dielectric layer 34 are provided at the conductive through vias 16. In the openings and between the first and second dielectric layers 34, 36 are first and second contacts 40, 42 and traces 44. The second contact 42 is redistributed from the first contact 40 and may be larger than the first contact 40 to accommodate the package bumps 46. The package bumps 46 are solder balls that electrically couple the package 10 to a substrate or board (not shown), such as a printed circuit board. The redistribution layer 32 and the encapsulation layer 30 form the outer surfaces of the package 10.

As shown in FIG. 1, a further package substrate is not provided in the SiP 10. Rather, the interposer 14 acts as the package substrate. In that regard, the SiPs disclosed herein may be substantially thinner than SiPs previously formed. In particular, the SiP of FIG. 1 may have a thickness of about 100 microns. This thickness, however, excludes the thickness of the package bumps 46, which may be about 200 microns, formed on the redistribution layer 32.

Although not shown, rather than having the semiconductor chips side by side on the interposer 14, the semiconductor chips may be stacked on top of each other to form a 3-D package, as is well known in the art. Furthermore, the semiconductor chips 12 may be coupled to each other without having the conductive path first exit the package 10. That is, the semiconductor chips may be coupled together through the interposer. Although the semiconductor chips 12 have the same reference number, it is to be understood that the semiconductor chips may be different from each other. For instance, one chip may be a memory chip and the other chip may be a microprocessor chip. This package has particular benefits if two different chips are present that interconnect with each other without the need to the interconnection to be outside of the package that houses both of them. The interposer board 14 can have connections between the microprocessor and the memory that permit instructions and data to be interchanged between them without any having additional pins and solder balls 46 outside of the pacakge. Although two semiconductor chips are shown, it is to be appreciated that any number of chips may be included in the package, including three, four or one chip stacked on top the other, in a vertical rather than horiztonal relationship. In the vertical arrangement, only a first, single chip is in contact with the interposer board 14 and the second chip is in electrical contact only with the first chip and not with the interposer board 14.

Figure 2A:
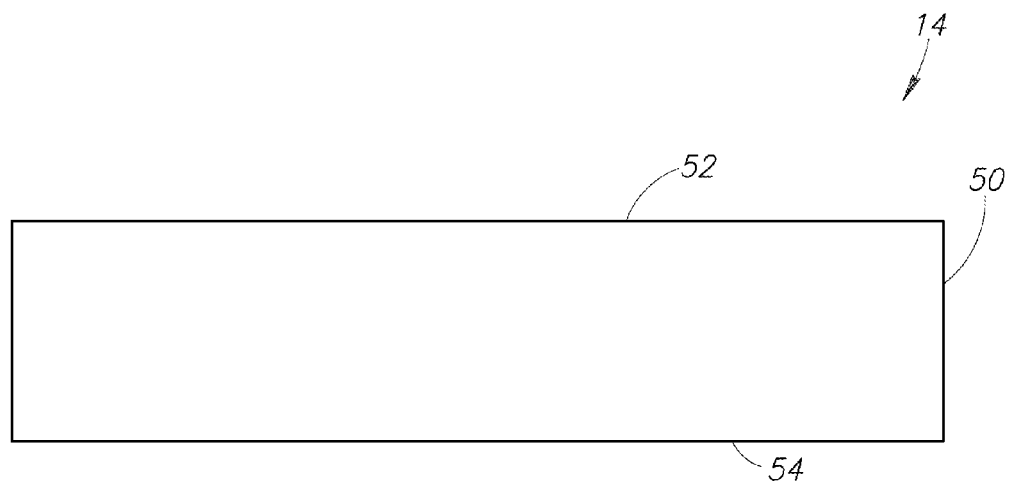
FIGS. 2A-2G illustrate exemplary method steps for forming an interposer of the package of FIG. 1.
Figure 2B:
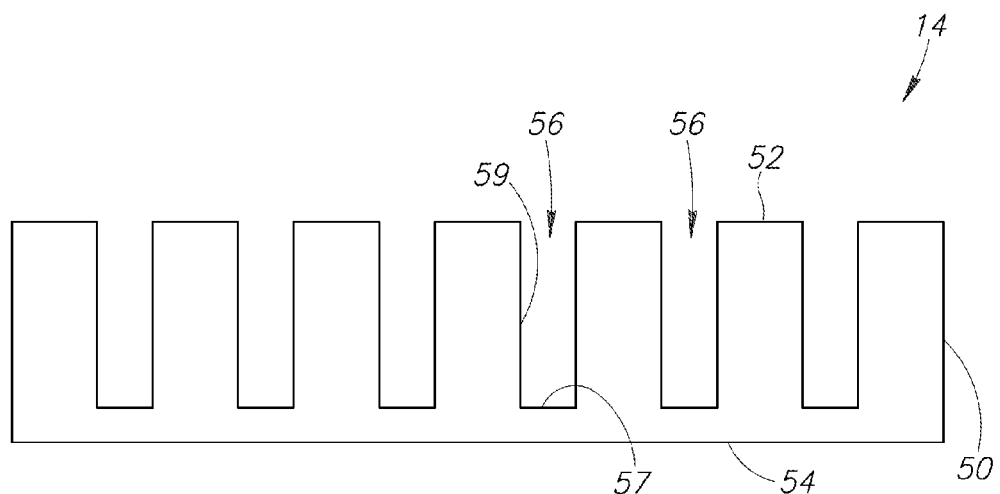

FIGS. 2A-2G illustrate exemplary method steps for forming an interposer 14 of the package of FIG. 1. FIG. 2A illustrates a portion of a substrate 50 having first and second sides 52, 54. The substrate 50 is sized and shaped as a wafer for processing on standard semiconductor equipment. As mentioned above, the substrate 50 in some embodiments may be silicon or glass. Although not shown, a dielectric (or insulating) layer may be located on one or more of the first and second sides 52, 54. The substrate 50 is patterned using standard semiconductor processing, such as photoresist and the like, to form a plurality of openings 56 in the first side 52 of the substrate 50, as shown in FIG. 2B. The openings 56 include bottom surfaces 57 and side surfaces 59. The openings may be about 10 microns or less.

Figure 2C:
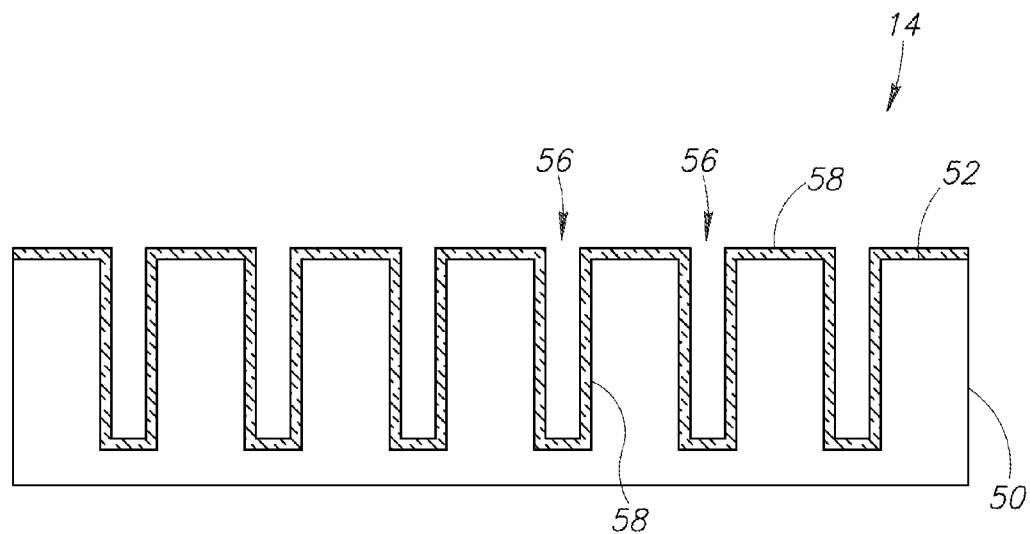

As shown in FIG. 2C, a dielectric material 58 is deposited on the bottom surfaces 57 and side surfaces 59 of the openings 56 using standard semiconductor deposition techniques. The dielectric material 58 is also deposited on the first side 52 of the substrate 50. The dielectric material 50 in one embodiment is silicon dioxide.

Figure 2D:
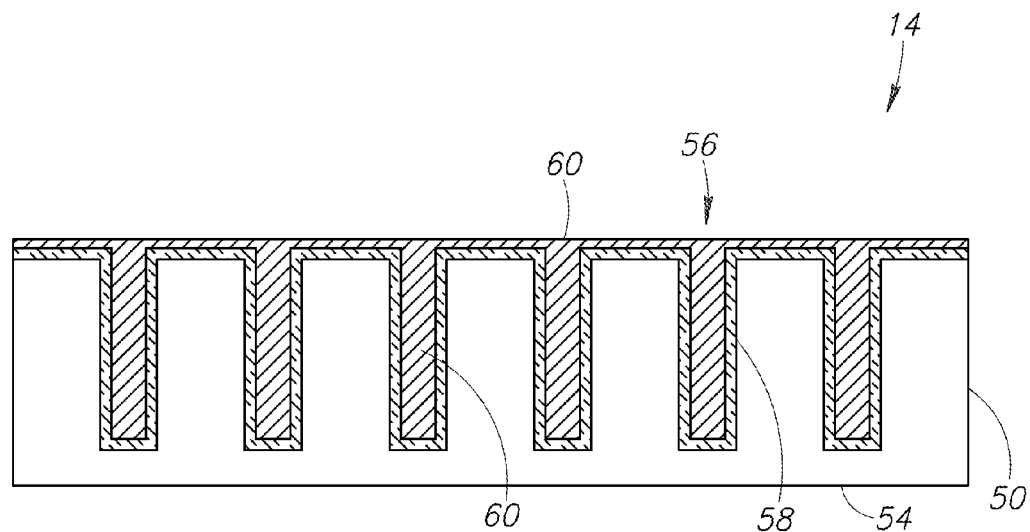

As shown in FIG. 2D, a conductive material 60 is deposited over the dielectric material 58 in the openings 56, filling the openings 56. In the illustrated embodiment, the conductive material 60 is also deposited over the first side 52 of the substrate 50. In one embodiment, the conductive material 60 is copper that is deposited by plating techniques.

Figure 2E:
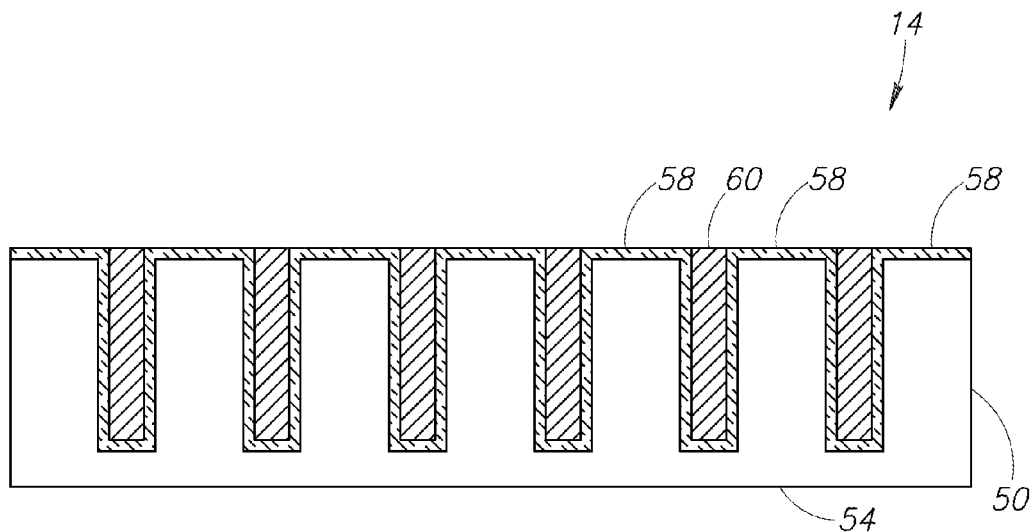

Referring to FIG. 2E, the conductive material 60 deposited over the first side 52 of the substrate 50 is removed during dry and/or wet etch processes using standard semiconductor processing techniques. The conductive material 60 in the openings 56 remains, forming first surfaces.

Figure 2F:
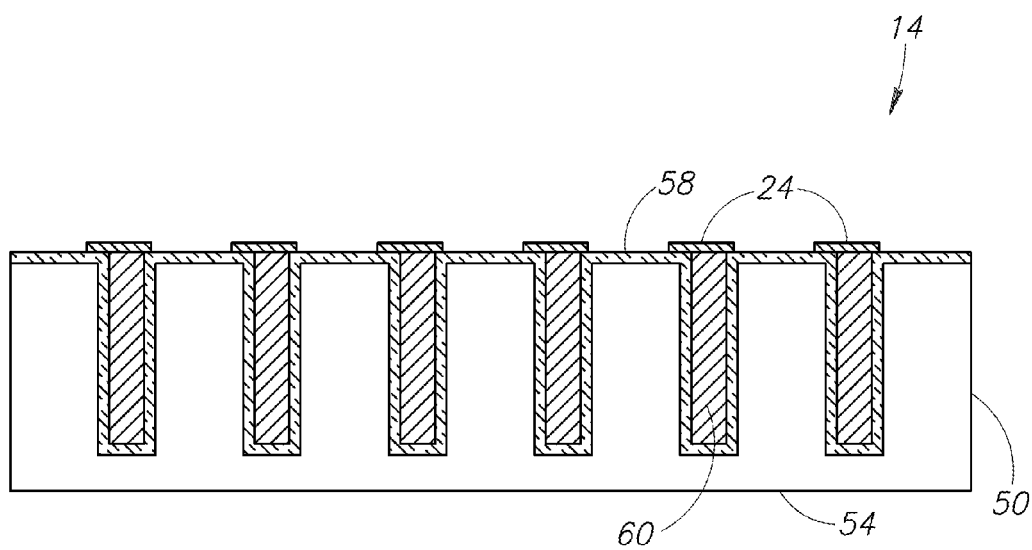

As shown in FIG. 2F, interconnects 24 are formed over the first surfaces of the conductive material 60 located in the openings 56. The interconnects 24 extend over a portion of the dielectric material 58 to provide a larger contact surface area. The interconnect material may be any conductive material suitable for providing adequate adhesion to the conductive material 60 and to pillar 26.

Figure 2G:
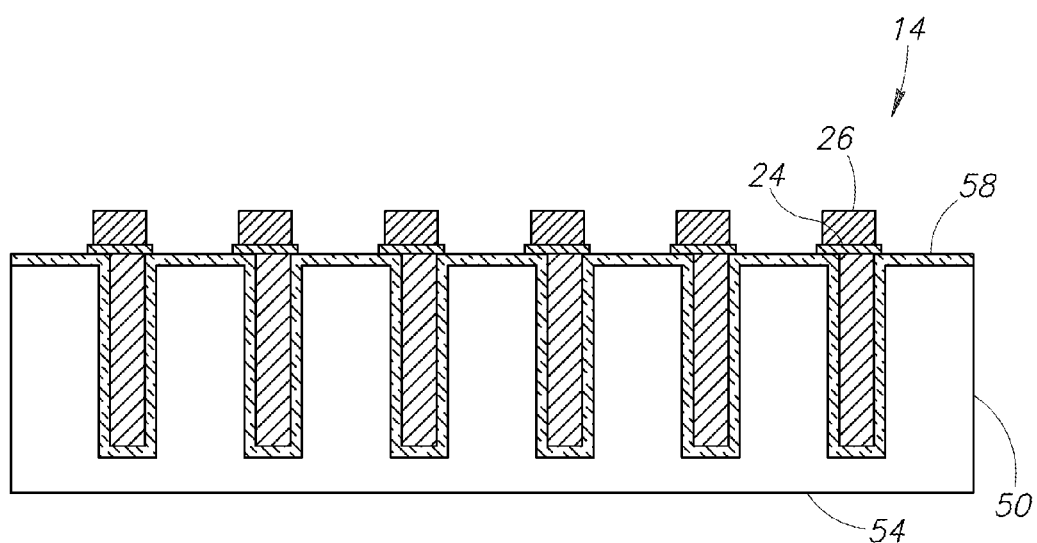

The pillars 26, such as copper pillars, are formed over the interconnects 24, respectively, as shown in FIG. 2G. The pillars 26 may be formed using standard plating techniques. The pillars 26 may allow for increased density of solder bumps, in part due to the fact that the pillars do not reflow with the solder material during flip chip attach. Pillars are discussed in detail in U.S. patent application Ser. No. 13/232,780, filed on Sep. 14, 2011, and incorporated herein by reference in its entirety. FIG. 2G illustrates the interposer 14 before the second side 54 of the substrate 50 is thinned as will be described below.

Figure 3A:
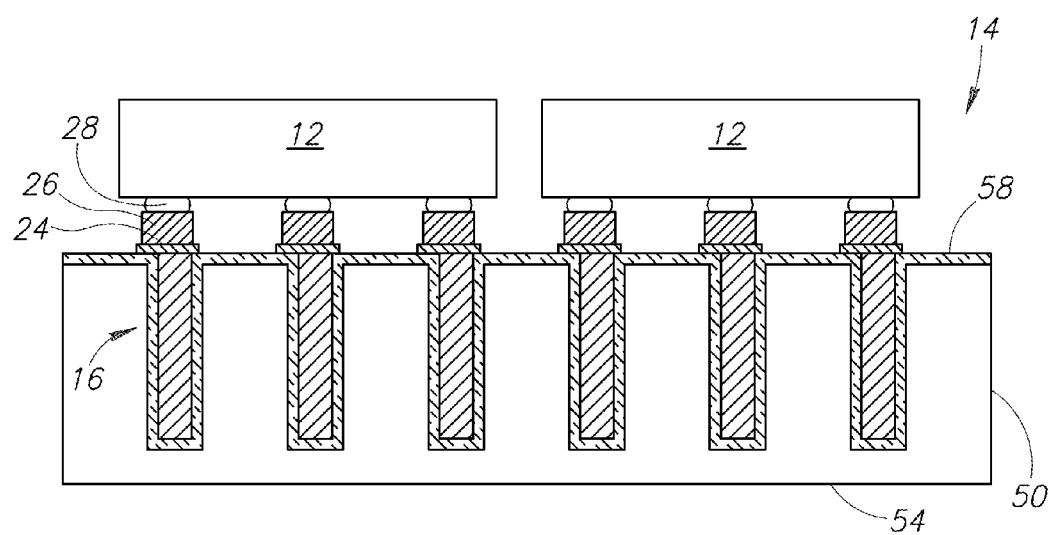
FIGS. 3A and 3B illustrate exemplary method steps for forming an interposer-chip assembly of the package of FIG. 1.

In FIG. 3A semiconductor chips 12 are attached to a first face of the interposer 14 using flip chip techniques. That is, bond pads on a front face of the semiconductor chips 12 are coupled to the pillars 26 of the first face of the interposer 14 by solder bumps 28 formed on the bond pads of the active face of the semiconductor chips 12, as discussed above.

Figure 3B:
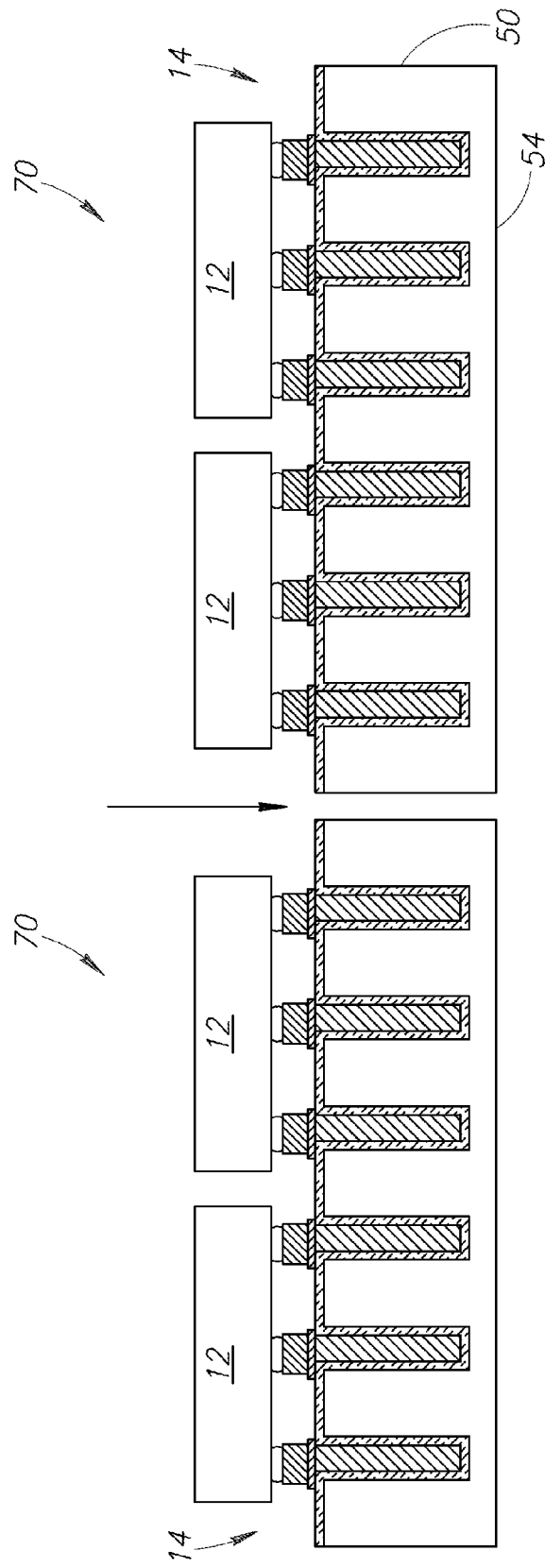

The interposer 14 is diced into individual interposer-chip assemblies 70 in a dicing step in streets, such as at a location indicated by the arrow in FIG. 3B. The dicing step may include a laser or saw process. Each interposer-chip assembly 70 includes two or more semiconductor chips 12. The interposer-chip assembly 70 has a back face, which is a backside of the semiconductor chips 12, and a front face, which is the second side 54 of the interposer 14.

Figure 4A:
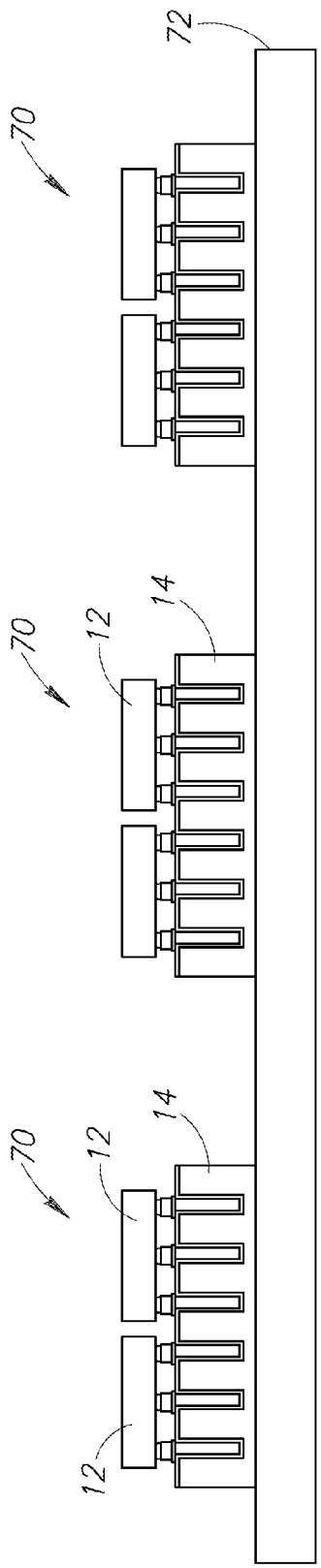

As shown in FIG. 4A, each of the interposer-chip assemblies 70 is positioned onto a carrier substrate 72 with the second side 54 of the interposer 14 facing the carrier substrate 72. The carrier substrate 72 may be any material configured to support the interposer-chip assemblies 70 during subsequent processing steps. The carrier substrate 72 is a glass substrate in one embodiment.

The interposer-chip assemblies 70 may be positioned on the carrier substrate 72 using a standard pick-and-place tool, in which each interposer-chip assembly 70 is positioned relative to another interposer-chip assembly 70 on the carrier substrate 72. Any number of interposer-chip assemblies 70 may be placed onto the carrier substrate 72.

The carrier substrate 72 includes an adhesive material and is configured to hold the individual interposer-chip assemblies 70 in position during subsequent process steps. The adhesive material is double-sided tape in one embodiment.

Figure 4B:
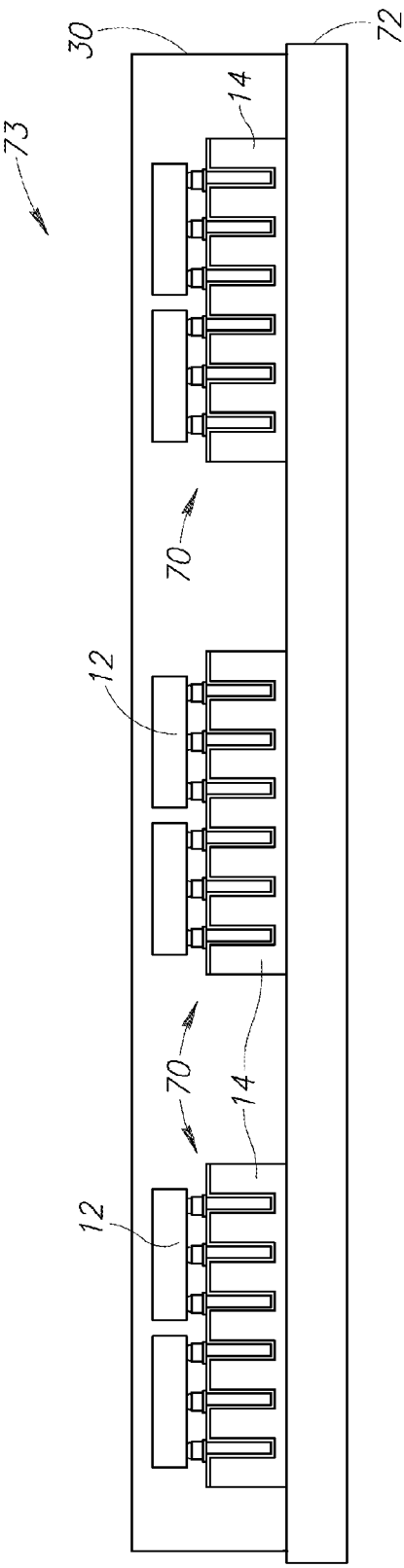

As shown in FIG. 4B, a reconstituted wafer 73 is formed by depositing an encapsulation layer 30 around the interposer-chip assembly 70 and on the carrier substrate 72. That is, the encapsulation layer 30 is formed around side surfaces and back surfaces of the interposer-chip assembly 70. The encapsulation material that forms the encapsulation layer 30 is suitably flowable prior to setting so that it penetrates between the interposer 14 and the semiconductor chips 12 to surround the solder bumps 28 and pillars 26. The encapsulation material may be molding compound that has a viscosity to provide the desired flow. The encapsulation material sets or hardens over time and may be curable. The molding compound process for forming the encapsulation layer 30 may be a compression molding process in which pressure is applied to the molding compound as it sets. In one embodiment, the encapsulation material is resin.

After the encapsulation layer 30 has set, the carrier substrate 72 may be removed, as shown in FIG. 4C, leaving the second side 54 of the substrate 50 exposed and surface 31 of the molding compound 30 and forming a reconstituted wafer 73. The reconstituted wafer 73 has a first face 75 and a second face 77.

In the illustrated embodiment, the surface 31 of the molding compound 30 of the reconstituted wafer 73 is offset slightly from the second side 54 of the interposer 14. The offset may occur due to the compression molding process discussed above and due to the adhesive material on the carrier compressing farther under the interposer-chip assembly 70 than under the molding compound 30. The offset may be about 5-10 microns.

As shown in FIG. 4D, the first face 75 of the reconstituted wafer 73 is subject to a chemical-mechanical polishing (CMP) step. The CMP step removes material from both the second side 54 of the interposer 14 and the surface 31 of the molding compound 30. In one embodiment, the CMP process the second side 54 of the interposer 14 is polished until the the conductive material 60 in the openings 54 is 5-10 microns from the second side 54 of the interposer 14.

As shown in FIG. 4E, the second side 54 of the interposer 14 and the surface 31 of the molding compound 30 are further thinned to expose a second surface 62 of the conductive material 60 and to form a substantially planar surface 75. In that regard, conductive through vias 16 (or a silicon through via (STV)) are formed through the interposer 14. The second side 54 of the interposer 14 may be thinned using any standard semiconductor processing techniques, such as one of or a combination of grinding and etching. In one embodiment, the second side 54 of the interposer 14 is thinned in a dry etching step. The final thickness of the interposer 14 may be any thickness suitable to support the semiconductor chips 12 in conjunction with the encapsulation layer 30. In one embodiment, the thickness of the interposer is between 50 and 100 microns.

The reconstituted wafer 73 can be made in any shape or size. Generally, however, the reconstituted wafer 73 is of a size and shape that conforms to standard semiconductor material wafers so that equipment designed for processing semiconductor wafers can be used to process the reconstituted wafer 73.

A redistribution layer 32 is formed on the front face of the reconstituted wafer 73 using techniques that are well known in the art. As indicated above, the redistribution layer 32 includes one or more dielectric layer and conductive layers that redistribute the surface contacts of the conductive layer through vias of the interposer.

Figure 4F:
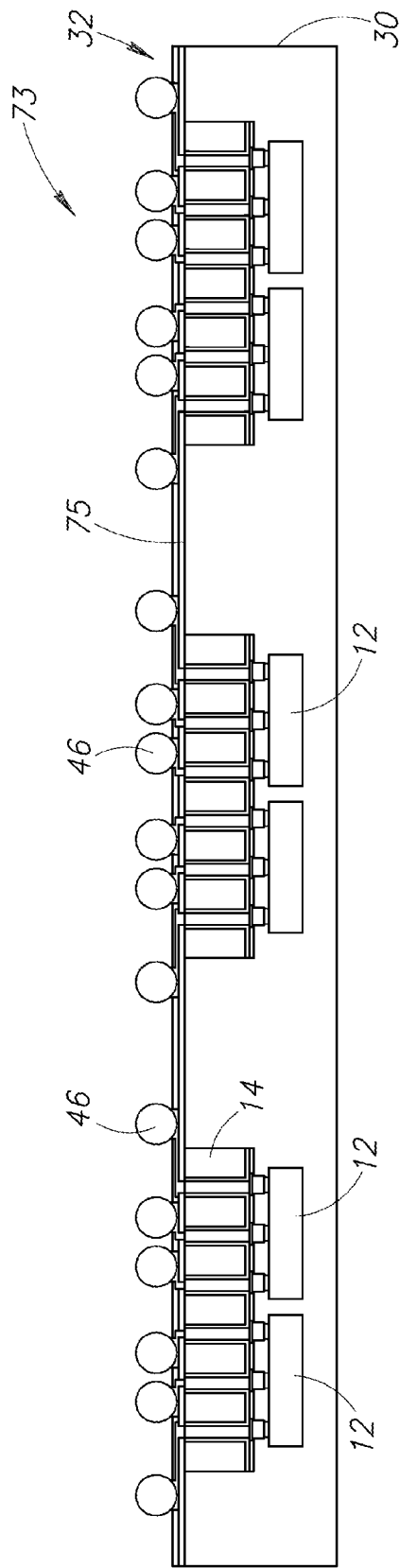
Figure 4G:
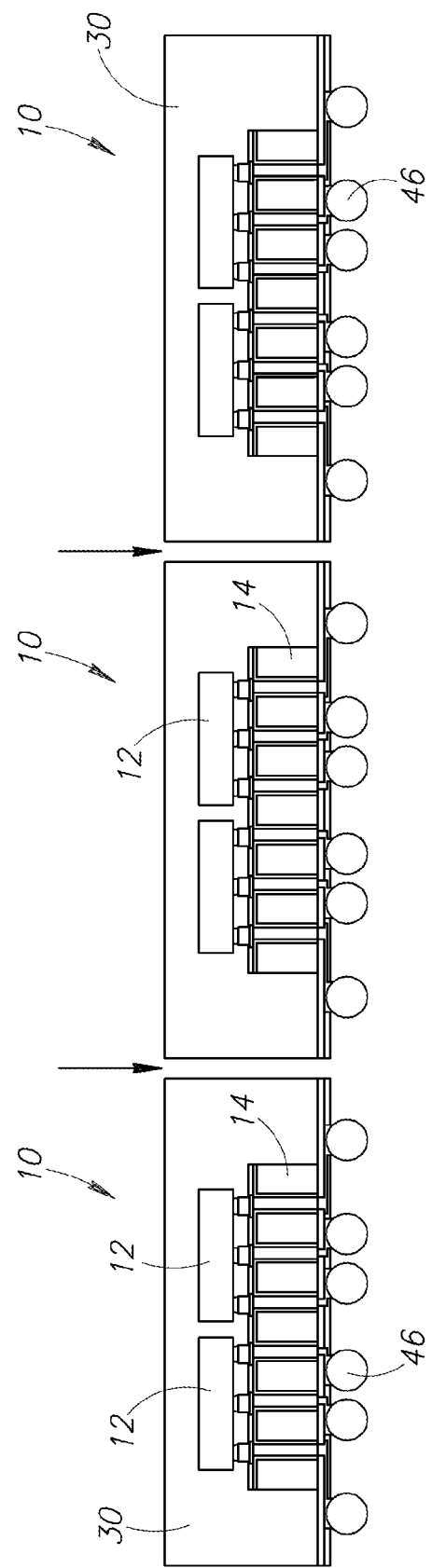

With reference to FIGS. 4F and 1, in one embodiment the redistribution layer 32 is formed by depositing a first dielectric layer 34 over the front face 75 of the reconstituted wafer 73. The first dielectric layer 34 is patterned to provide openings facing the conductive through vias 16. Conductive material is deposited over the first dielectric layer 34 and in the openings to form the first contacts 40 and traces 44. A second dielectric layer 36 is deposited and patterned to cover the traces 44, first contacts 40, and the first dielectric layer 34 with the second contacts 42 remaining exposed. The first and second dielectric layers 34, 36 may be polyimide and are 5-10 microns thick in one embodiment. The contacts can be "redistributed" to conform to any desired configuration, by providing the desired electrical traces. Solder bumps 46 are formed on the second contacts 42 and are configured to couple the SiP 10 to a PCB.

As shown in FIG. 4F, the reconstituted wafer 73 is subject to a dicing step in which the packages 10 are separated from each other along streets that separate the packages from each other.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming an interposer by:
        forming openings in a first side of a substrate, the openings having bottom surfaces and sidewalls, the substrate including a second side spaced apart from the first side by sidewalls;
        depositing dielectric material in the openings along the bottom surfaces and sidewalls;
        depositing a conductive material over the dielectric material filling the openings; and
        removing a portion of the substrate on the second side to expose the conductive material in the openings; and
    electrically coupling bond pads of a plurality of semiconductor chips to the conductive material in the openings at the first side of the interposer;
    dicing the interposer into individual interposer-semiconductor chip assemblies, each interposer-semiconductor chip assembly including at least two of the plurality of semiconductor chips;
    placing the interposer-semiconductor chip assemblies onto a carrier substrate; and
    forming an encapsulation layer around the interposer-semiconductor chip assemblies and over the carrier substrate and between the first side of the interposer and the semiconductor chips.

2. The method of claim 1 further comprising performing a dicing step to form a plurality of individual system-in-packages.

3. The method of claim 1, wherein electrically coupling the bond pads comprises using flip chip technology to electrically couple the bond pads of the plurality of semiconductor chips to pillars coupled to the conductive material in the openings of the interposer.

4. The method of claim 1 wherein forming an encapsulation layer comprises using a molding process to flow a molding compound around the plurality of interposer-semiconductor chip assemblies and between the first side of the interposer and the semiconductor chips and hardening the molding compound.

5. The method of claim 1 wherein forming openings comprises etching openings in the first side of the substrate.

6. The method of claim 1 wherein the substrate of the interposer is a silicon substrate.

7. A method of forming a system-in-package, the method comprising:
    forming openings in a first side of a substrate, the openings having bottom surfaces and sidewalls, the substrate including a second side spaced apart from the first side by sidewalls;
    depositing dielectric material in the openings along the bottom surfaces and sidewalls;
    depositing a conductive material over the dielectric material filling the openings;
    removing a portion of the substrate on the second side to expose the conductive material in the openings;
    electrically coupling bond pads of a first semiconductor chip to the conductive material in the openings using flip chip technology; and
    forming an encapsulation layer around the first chip, the first side and the sidewalls of the substrate, and between the first chip and the first side of the substrate.

8. The method of claim 7 wherein:
    electrically coupling bond pads comprises electrically coupling bond pads of first and second chips to the conductive material in the openings using flip chip technology; and
    wherein forming the encapsulation layer comprises forming the encapsulation layer around the first and second chips, the first side and the sidewalls of the substrate, and between the first and second chips and the first side of the substrate.

9. The method of claim 8 wherein electrically coupling bond pads comprises electrically coupling bond pads of first and second chips to the conductive material comprising:
    forming solder bumps on the bond pads of the first and second chips;
    forming pillars over the conductive material in the openings;
    placing the first and second chips on the substrate so that the solder bumps contact the pillars, respectively; and
    reflowing the solder bumps to adhere the solder to the pillars.

10. The method of claim 8 wherein forming the encapsulation layer around the first and second chips comprises providing a molding compound that flows between the first and second chips and first side of the substrate and hardening the molding compound.

11. The method of claim 7 wherein filling the openings comprises plating copper in the openings.

12. The method of claim 7 wherein removing the portion of the substrate on the second side comprises using a grind process to remove the portion of the substrate.

13. The method of claim 12 wherein removing the portion of the substrate further comprises using an etch step to further remove the portion.

14. The method of claim 7 further comprising forming a redistribution layer on the second side of the substrate and a surface of the encapsulation layer.

15. A system-in-package comprising:
    an interposer that includes first and second surfaces and a plurality of conductive through vias extending between the first and second surfaces;
    a plurality of semiconductor chips electrically coupled to the first surface of the interposer;
    an encapsulation layer surrounding the semiconductor chips and located along side surfaces of the interposer and between the semiconductor chips and the first surface of the interposer, the encapsulation layer having a substantially planar surface with the second surface of the interposer; and
    a redistribution layer located on the substantially planar surface of the second surface of the interposer and the encapsulation layer.

16. The system-in-package of claim 15 wherein the plurality of semiconductor chips are electrically coupled to the first surface of the interposer in a flip chip configuration.

17. The system-in-package of claim 15 wherein the plurality of semiconductor chips are two semiconductor chips.

18. The system-in-package of claim 15 wherein the redistribution layer includes first and second dielectric layers and conductive traces located between the first and second dielectric layers.

* * * * *